US008128856B2

(12) United States Patent  
Chou

(10) Patent No.: US 8,128,856 B2
(45) Date of Patent: Mar. 6, 2012

(54) RELEASE SURFACES, PARTICULARLY FOR USE IN NANOIMPRINT LITHOGRAPHY

(75) Inventor: Stephen Y. Chou, Princeton, NJ (US)

(73) Assignee: Regents of the University of Minnesota, Minneapolis, MN (US)

( * ) Notice: Subject to any disclaimer, the term of this patent is extended or adjusted under 35 U.S.C. 154(b) by 131 days.

(21) Appl. No.: 11/773,719

(22) Filed: Jul. 5, 2007

(65) Prior Publication Data

US 2008/0012184 A1 Jan. 17, 2008

Related U.S. Application Data

(60) Continuation-in-part of application No. 11/003,107, filed on Dec. 3, 2004, now abandoned, which is a division of application No. 10/244,303, filed on Sep. 16, 2002, which is a continuation of application No. 10/046,594, filed on Oct. 29, 2001, which is a division of application No. 09/107,006, filed on Jun. 30, 1998, now Pat. No. 6,309,580, which is a continuation-in-part of application No. 08/558,809, filed on Nov. 15, 1995, now Pat. No. 5,772,905.

(51) Int. Cl.
B29C 33/64 (2006.01)

(52) U.S. Cl. ........................................ 264/319; 264/496

(58) Field of Classification Search .................. 216/44; 264/319, 496
See application file for complete search history.

(56) References Cited

U.S. PATENT DOCUMENTS

| | | | | |
|---|---|---|---|---|
| 3,268,378 A | * | 8/1966 | Broderick | 216/9 |
| 4,283,482 A | * | 8/1981 | Hattori et al. | 430/296 |
| 4,407,880 A | * | 10/1983 | Terao et al. | 428/156 |
| 4,731,155 A | * | 3/1988 | Napoli et al. | 216/44 |
| 4,775,554 A | * | 10/1988 | Ponjee | 427/133 |
| 5,294,291 A | * | 3/1994 | Akahoshi et al. | 216/12 |
| 5,521,030 A | * | 5/1996 | McGrew | 430/1 |
| 5,527,662 A | * | 6/1996 | Hashimoto et al. | 430/296 |
| 5,538,674 A | * | 7/1996 | Nisper et al. | 264/1.31 |
| 5,830,990 A | * | 11/1998 | Rahman | 528/482 |
| 6,027,595 A | * | 2/2000 | Suleski | 156/230 |
| 6,054,007 A | * | 4/2000 | Boyd et al. | 156/245 |
| 6,309,580 B1 | * | 10/2001 | Chou | 264/338 |
| 6,334,960 B1 | * | 1/2002 | Willson et al. | 216/52 |
| 6,355,198 B1 | * | 3/2002 | Kim et al. | 264/259 |
| 2002/0064896 A1 | * | 5/2002 | Zhao et al. | 438/31 |

FOREIGN PATENT DOCUMENTS

JP 59-042933 * 3/1984

* cited by examiner

*Primary Examiner* — Joseph Del Sole
*Assistant Examiner* — Kimberly A Stewart
(74) *Attorney, Agent, or Firm* — Polster, Lieder, Woodruff & Lucchesi, L.C.

(57) ABSTRACT

A method to forming a pattern on a surface of a substrate, including the steps of providing a mold having a molding surface comprised of one or more protruding features and one or more recessed features for imprinting a pattern. The pattern comprising at least one feature having a lateral dimension of about 2000 nanometer or less. Providing a monomolecular anti-adhesive layer on the mold which is either continuous or discontinuous, prior to depositing a hardenable, flowable material onto the mold and recessed features. The mold and substrate are pressed together, while the flowable material hardens and adheres to the moldable material and the substrate. Upon separation of the mold and the substrate, the hardened material remains on the substrate.

18 Claims, 13 Drawing Sheets

PATTERNING STRUCTURES ON A SUBSTRATE BY VAPOR DEPOSITION MOLDING

RELEASE SURFACES, PARTICULARLY FOR USE IN NANOIMPRINT LITHOGRAPHY

CROSS-REFERENCE TO RELATED APPLICATIONS

The present application is a continuation-in-part of U.S. patent application Ser. No. 11/003,107 by Stephen Y. Chou, filed on Dec. 3, 2004, from which priority is claimed and which is herein incorporated by reference. The '107 application is a divisional of U.S. patent application Ser. No. 10/244,303, filed Sep. 16, 2002, which is a continuation of U.S. patent application Ser. No. 10/046,594, filed on Oct. 29, 2001, which is a divisional of U.S. patent application Ser. No. 09/107,006 filed on Jun. 30, 1998, now U.S. Pat. No. 6,309,580, which is a continuation-in-part of U.S. patent application Ser. No. 08/558,809, filed on Nov. 15, 1995, now U.S. Pat. No. 5,772,905. Each of the aforementioned patents and applications is herein incorporated by reference.

The present application is related to U.S. patent application Ser. No. 10/244,276 filed by Stephen Y. Chou on Sep. 16, 2002 and entitled "Lithographic Method For Molding Pattern With Nanoscale Features", and to U.S. patent application Ser. No. 10/244,296 filed by Stephen Y. Chou on Sep. 16, 2002 and entitled "Lithographic Method With Bonded Release Layer For Molding Small Patterns", each of which are herein incorporated by reference.

STATEMENT REGARDING FEDERALLY SPONSORED RESEARCH

Not Applicable.

BACKGROUND OF THE INVENTION

The present invention relates to lithography that may be used to produce integrated circuits and microdevices. More specifically, the present invention relates to a process of using an improved mold or microreplication surface in a process that creates patterns with ultra fine features in a thin film carried on a surface of a substrate.

In the fabrication of semiconductor integrated electrical circuits, optical, magnetic, mechanical circuits and microdevices, and the like, one of the key processing methods is lithography and especially photolithography. Lithography can be used, along with its traditional resist imaging in the formation of printing plates and resist images, to create a pattern in a thin film carried on a substrate so that, in subsequent process steps, the pattern can be replicated in the substrate or in another material which is added onto the substrate. The thin film which accepts a pattern or image during the lithographic process is often referred to as resist. The resist may be either a positive resist or a negative resist, depending on its operation of formation. For example, a positive photoresist becomes more soluble in a solvent irradiated and a negative resist becomes more insoluble where irradiated. A typical lithographic process for integrated circuit fabrication involves irradiating a photoresist composition or film with a beam of radiation particles, including light, energetic particles (which may be electrons), photons, or ions, by either passing a flood beam through a mask or scanning a focused beam. The radiation or particle beam changes the chemical structure of the exposed area of the film, so that when washed or immersed in a developer, either the exposed area or the unexposed area of the resist will be removed to recreate the patterns on its obverse of the mask or the scanning. The lithography resolution is limited by the wavelength of the particles and the resolution of the beam, the particle scattering in the resist and the substrate, and the properties of the resist.

There is an ongoing need in art of lithography to produce progressively smaller pattern sizes while maintaining cost efficiency in the process. There is a great need to develop low-cost technologies for mass producing sub-50 nm structures since such a technology could have an enormous impact in many areas of engineering and science. Not only will the future of semiconductor integrated circuits be affected, but also the commercialization of many innovative electrical, optical, magnetic, mechanical microdevices that are far superior to current devices will rely on the possibility of such technology. Additionally optical materials, including reflective coatings and reflective sheeting (as may be used for security purposes or for signage) can use microreplication techniques according to lithographic technology.

Numerous technologies have been developed to service these needs, but they all suffer serious drawbacks and none of them can mass produce sub-50 nanometer features at a low cost. Electron beam lithography has demonstrated 10 nm lithography resolution. A. N. Broers, J. M. Harper, and W. W. Molzen, Appl. Phys. Lett. 33, 392 (1978) and P. B. Fischer and S. Y. Chou, Appl. Phys. Lett. 62, 2989 (1993). However, using these technologies for mass production of sub-50 nm structures seems economically impractical due to inherent low throughput in a serial processing tool. X-ray lithography, which can have a high throughput, has demonstrated 50 nm lithography resolution. K. Early, M. L. Schattenburg, and H. I. Smith, Microelectronic Engineering 11, 317 (1990). But X-ray lithography tools are expensive and their ability for mass producing sub-50 nm structures is yet to be commercially demonstrated. Lithography based on scanning probes has produced sub-10 nm structures in a very thin layer of materials. However, the practicality of such lithography in a manufacturing tool is hard to judge at this point.

Imprint technology using compressive molding of thermoplastic polymers is a low cost mass manufacturing technology and has been around for several decades. Features with sizes greater than 1 micrometer have been routinely imprinted in plastics. Compact disks which are based on imprinting of polycarbonate are one example of the commercial use of this technology. Other examples are imprinted polymethyl methacrylate (PMMA) structures with a feature size on the order to 10 micrometers for making micromechanical parts. H. Harmening, W. Bacher, P. Bley, A. El-Kholi, H. Kalb, B. Kowanz, W. Menz, A. Michel, and J. Mohr, Proceedings IEEE Micro Electro Mechanical Systems, 202 (1992). Molded polyester micromechanical parts with feature dimensions of several tens of microns have also been used. H. Li and S. D. Senturia, Proceedings of 1992 13th IEEE/CHMT International Electronic Manufacturing Technology Symposium, 145 (1992).

BRIEF SUMMARY OF THE INVENTION

The present invention relates to a method and apparatus for performing ultra-fine line lithography of the type used to produce integrated circuits and microdevices. A layer of thin film is deposited upon a surface of a substrate. A mold having its mold surface treated with the release materials of the present invention and at least one protruding feature and a recess is molded into the thin film, therefore the thickness of the film under the protruding feature is thinner than the of the film under the recess and a relief is formed in the thin film. The relief generally conforms to the shape of the feature on the mold. After the mold is removed from the film, the thin film is processed such that the thinner portion of the film in the relief is removed, exposing the underlying substrate. Thus, the pattern in the mold is replicated in the thin film, completing the lithography. The patterns in the thin film will be, in subsequent processes, reproduced in the substrate or in another material that is added onto the substrate. The use of the release treatment on the mold surface enhances the resolution of the image and can protect the mold so that it can be used more often without showing wear on fine features in the mold.

The invention described here is based on a fundamentally different principle from conventional lithography. The process invention can eliminate many resolution limitations imposed in conventional lithography, such as wavelength limitation, backscattering of particles in the resist and substrate, and optical interference. It has been demonstrated the present invention can include a high throughput mass production lithography method for generating sub-25 nm features. Furthermore, the present invention has the ability to mass produce sub-10 nm features at a low cost. These capabilities of the present invention is unattainable with the prior art, and the use of the adherent release property coating improves the durability and the resolution of the process even further. The present process, however, has implications and utility for more macroscopic details in molding surfaces and would include features in the 50 nm range, the super-100 nm range, and the super 200 nm range, as well as macroscopic dimensions in the visual range of features (e.g. 0.1 mm and greater).

BRIEF DESCRIPTION OF THE DRAWINGS

The foregoing features, and advantages set forth in the present disclosure as well as presently preferred embodiments will become more apparent from the reading of the following description in connection with the accompanying drawings. In the accompanying drawings which form part of the specification.

Corresponding reference numerals indicate corresponding parts throughout the several figures of the drawings. It is to be understood that the drawings are for illustrating the concepts set forth in the present disclosure and are not to scale.

DESCRIPTION OF THE PREFERRED EMBODIMENT

Figure 1A:
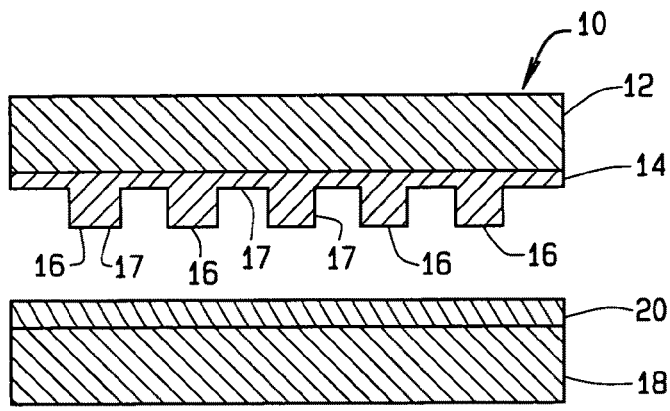
FIG. 1A is a cross sectional view showing a mold and substrate in accordance with the present invention.

This invention also relates to a method and apparatus for a resolution, high-throughput, lithography. Unlike current microlithography, a preferred embodiment of the present invention abandons usage of energetic light or particle beams. The present invention is based on pressing a mold into a thin film on a substrate to create a relief and, later removing the compressed area of the film to expose the underlying substrate and to form a resist pattern on the substrate that replicates the obverse of the protruding pattern of the mold.

The present invention also has demonstrated the generation of patterns, such as holes, pillars, or trenches in a thin film on a substrate, that have a minimum size of 25 nm, a depth over 100 nm, a side wall smoothness better than 3 nm, and corners with near perfect 90 degrees angles. it was found that presently the size of imprinted features is limited by the size of the mold being used; with a suitable mold, the present invention should create sub-10 nm structures with a high aspect ratio. Furthermore, using one embodiment of the present invention that including a material deposition and a lift-off process, 100 nm wide metal lines of a 200 nm period and 25 nm diameter metal dots of 125 nm period have been fabricated. The resist pattern created using the present invention also has been used as a mask to etch nanostructures (features having dimensions less than 1000 nm, preferably less than 500 nm) into the substrate.

The present invention offers many unique advantages over the prior art. First, since it is based on a paradigm different from the prior art and it abandons the usage of an energetic particle beam such as photons, electrons, and ions, the present invention eliminates many factors that limit the resolution of conventional lithographies, such as wave diffraction limits due to a finite wavelength, the limits due to scattering of particles in the resist and the substrate, and interferences. Therefore the present invention offers a finer lithography resolution and much more uniform lithography over entire substrate than the prior art. Results show it can achieve sub-25 nm resolution. Second, the present invention can produce sub-25 features in parallel over a large area, leading to a high throughput. This seems unachievable with the prior art. And thirdly, since no sophisticated energetic particle beam generator is involved, the present invention can achieve a sub-25 nm lithography over a large area at a cost much lower than the prior art. These advantages make the present invention superior to the prior art and vital to future integrated circuit manufacturing and other areas of science and engineering where nanolithography is required.

The non-continuous coatings of molecules are formed from a specific type of reactive compound. These compounds may be characterized by the following structure:

RELEASE-M(X)n or

RELEASE-M(OR)n, where

RELEASE is a molecular chain of 4 to 20 atoms in length, preferably from 6 to 16 atoms in length, which molecule has either polar or non-polar properties, depending upon the phobicity desired towards a molding agent;

M is an inorganic atom, especially a metal atom, semiconductor atom, or semimetal atom;

X is halogen or cyano, especially Cl, F, or Br;

R is hydrogen, alkyl, or phenyl, preferably hydrogen or alkyl of 1 to 4 carbon atoms, most preferably hydrogen, methyl or ethyl; and;

(n) is the valence −1 of M, usually 1, 2 or 3 depending upon the nature of M.

The actual moiety bonded to the surface has one of the groups bonded to the metal or semimetal atom removed during a reaction with the mold surface and may have the structural formula:

RELEASE-M(X)n−1 or

RELEASE-M(OR)n−1, wherein

RELEASE is a molecular chain of from 4 to 20 atoms in length, preferably from 6 to 16 atoms in length, which molecule has either polar or non-polar properties;

M is a metal or semimetal atom;

X is halogen or cyano, especially Cl, F, or Br;

R is hydrogen, alkyl or phenyl, preferably hydrogen or alkyl of 1 to 4 carbon atoms; and;

(n) is the valence −1 of M.

As noted above, the properties of RELEASE are determined in part by the nature of the molded material to be used with the surface or the nature of the properties desired on the surface. That is where the surface is to be used in microreplication with a polar polymeric material, the RELEASE properties must be non-polar. Non-polar RELEASE groups are preferably selected, for example, from non-polar molecular units including especially siloxane units and highly fluorinated or fluorocarbon units. It is further preferred that these non-polar molecular units are linear units of from 4 to 20 skeletal atoms in the linear chain. Smaller chains might not form as continuous of release properties as desired, and longer chains might mask features on the surface to be replicated. By highly fluorinated is meant that at least ⅔ of all substituents on the carbon are fluorinated units, with the remaining units comprising Cl or H. Preferably the terminal carbon is perfluorinated, more preferably the terminal carbon atom is perfluorinated and no hydrogen atoms are present on the three terminal atoms, and most preferably the chain is perfluorinated.

M is preferably a metal atom, semiconductor atom or semimetal atom such as for example, Si, Ti, Zr, Cr, Ge, and the like. Most preferably M is Si. In these cases, n would preferably be 3.

Examples of the compounds which can be used in the practice of the present invention comprise perflourohexyl, trichlorosilane, perfluoroctyle trichlorosilane, perfluorodecyl trichlorosilane, perfluorododecyl trichlorosilane, perfluorodecyl dichlorobromosilane, polydimethyliolxane-trichlorosilane (with n preferably of about 4 to 20 for the polydimethylsiloxane unit), perfluorodecyldichlorobromogermanium, perfluorodecyl, dichlorobromochromium, and the like.

The mold surfaces to be used may be any surface to which the release providing molecules may bond. By selecting appropriate release providing molecules, substantially any mold surface may be used. The mold surface may be metallic, semimetalic, metal oxides, metal and semimetal carbides and nitrides, oxide, polymeric, semiconductors, photocinductors, ceramic, glass, composite or the like, as is known in the molding and microreplication art. Particularly useful substrates include, but are not limited to, silicon, silicon nitride, silicon carbide, silicon nitride, doped semiconductor blends, photoconductors (both organic and inorganic), and the like.

The molding process may include impression molding as generally described above, injection molding, powder molding, blow molding, casting or cast molding, vapor deposition molding, decomposition molding (where materials are decomposed to form new materials which deposit on the surface), and the like.

Figure 10:
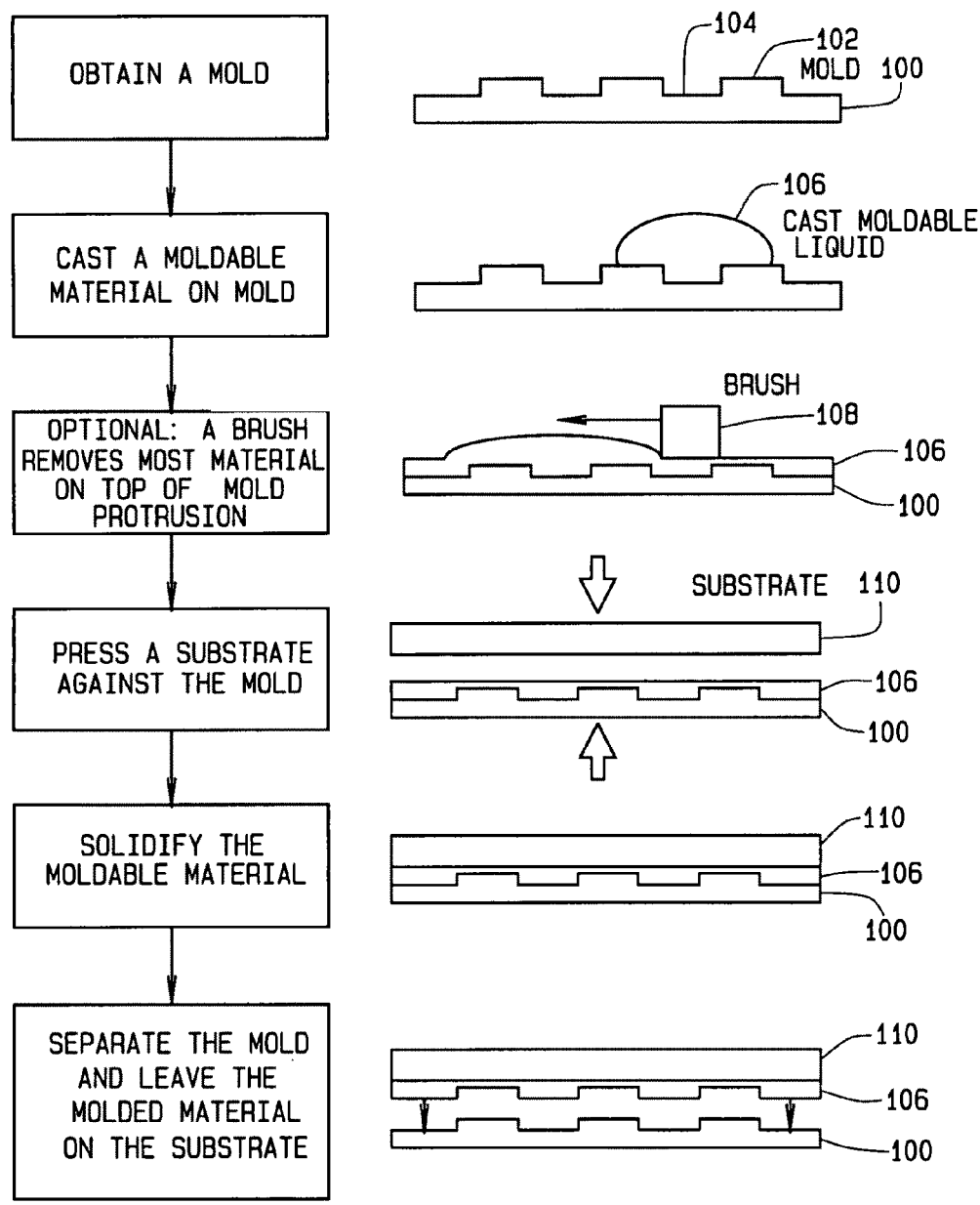
FIG. 10 is a schematic flow diagram of the steps in patterning nanostructures on a substrate by cast molding.

In patterning nanostructures on a substrate by cast molding, as shown in FIG. 10, first a mold 100 that has at least one protrusion 102 and one recess 104 is made. Then a flowable, moldable, and hardenable molding material, such as a liquid 106, is cast on the top surface of a mold 100. The flowable material 106 fills the recess 104 on the mold 100 either completely or partially. As an optional step, a brush 108 can remove some or most of the flowable materials 106 on the protrusion of the mold 102, while keep the flowable material 106 in the recess 104 of the mold 100. Then a substrate 110 is pressed against the mold top surface cast with molding material, followed by a hardening of the flowable material 106. Depending upon the moldable material cast, the hardening can be any process that changes the moldable material from flowable state to a non-flowable state. For examples, the hardening includes a curing using radiation of light, electrical current, chemical reaction, or temperature change. After hardening, the mold 100 is separated from the moldable material 106, and the molded material 106 sticks to the substrate 110. In patterning by cast molding, the molding material is supported by the mold against gravity.

In an example of cast molding, a silicon mold made of quartz with lateral features from one nanometer to 2,000 nanometers is used with the patterned-surface features facing up. A moldable flowable liquid composed of a mixture of monomers or oligomers and photo-sensitive curable cross-linkers is cast on top of the mold surfaces. The liquid has a viscosity from 0.5 center-poise to 500 center-poise. After casting, the moldable flowable liquid is supported on top of the mode and can fill at least on recess of the mold by the gravitational force. A brush is used to remove the extra material on top of the protrusions of the mold. Then, a silicon wafer with or without prepatterned structures on the surface will be pressed against the mold. Then a UV light with a wavelength of 300-400 nanometers shining through the mold to cure the liquid into gel or solid, and makes it stick into the substrates. Then the mold is separated from the molded material.

In the optional brushing mentioned above, the brush 108 could be made of a blade (of different materials) or an airbrush that use an air (or other gases) coming from a nozzle. The air brush nozzle can have different shapes (e.g. blade shape, point shape), use different gas pressures (0.001 psi to 1000 psi), and have different distance from (10 microns to 10 centimeters). In operation, there will be a relative movement between the brush 108 and the mold 100, so that some molding material 106 will be removed. In addition to brush 108, there might be a vacuum suction device or devices that take away some molding materials brushed away by a brush 108.

Figure 11:
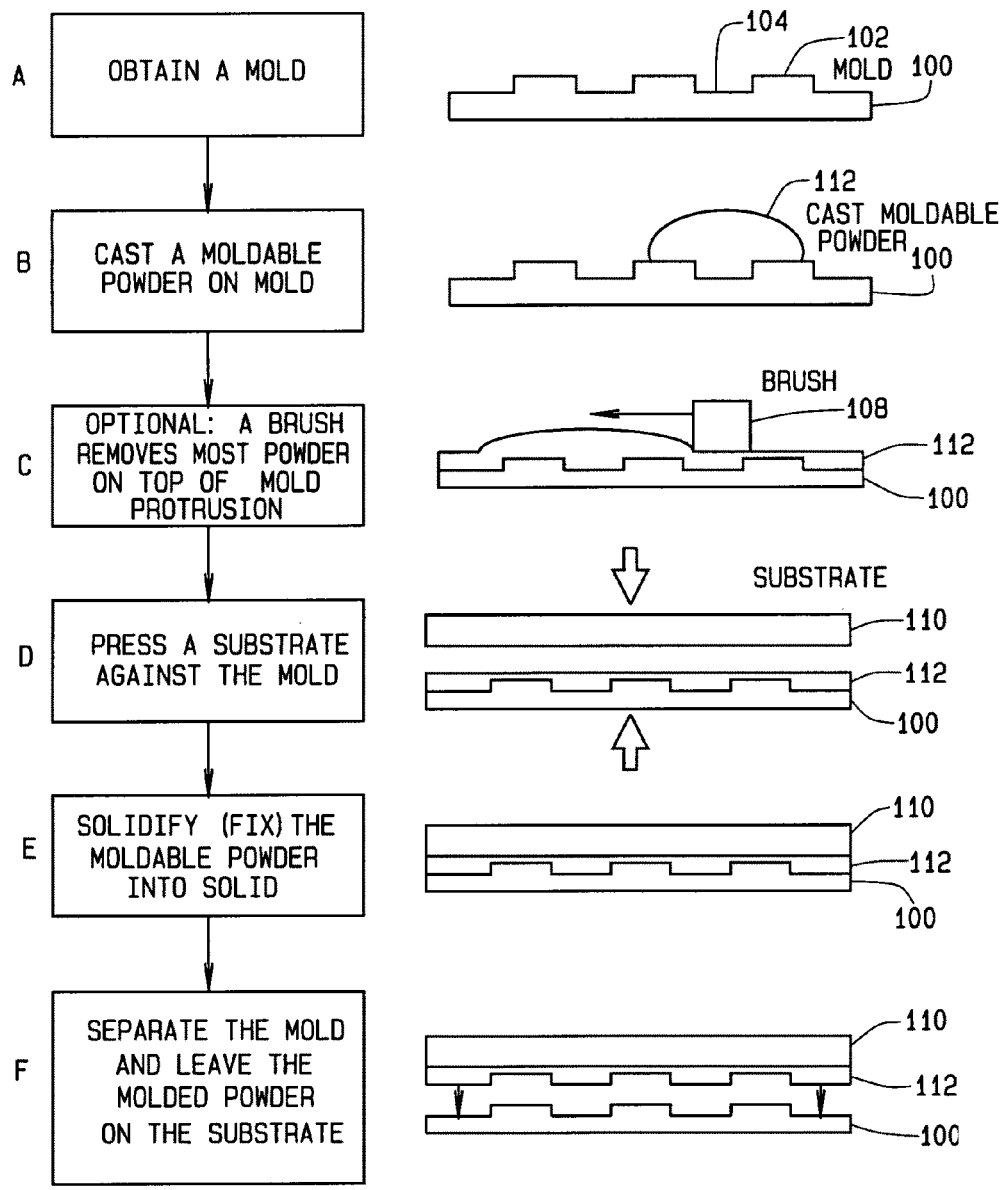
FIG. 11 is a schematic flow diagram of the steps in patterning nanostructures on a substrate by powder molding.

In patterning nanostructures on a substrate by powder molding as shown in FIG. 11, the process is similar to that by a casting molding described above, except the powders 112 rather than moldable liquid 106 is deposited on the mold 100, and fixing the powders may be different. Depending on the powder particle size, the powder 112 can flow unassisted or flow under certain assistance into the recessed areas 104 of a mold surface. After the powder hardens, the substrate 110 will be separated from the mold 100 and the hardened molded part of the material 112 will stick to the substrate 110. Depending upon the moldable powder materials used, the hardening can be any process that changes the moldable material 112 from flowable or moldable state to a non-flowable or harden state. For examples, the hardening of the powders includes using of light (photons of different wavelength, e.g. 1 nanometer to 20 microns of wavelength), electrical current, chemical reaction, temperature change, or pressure change.

Figure 12:
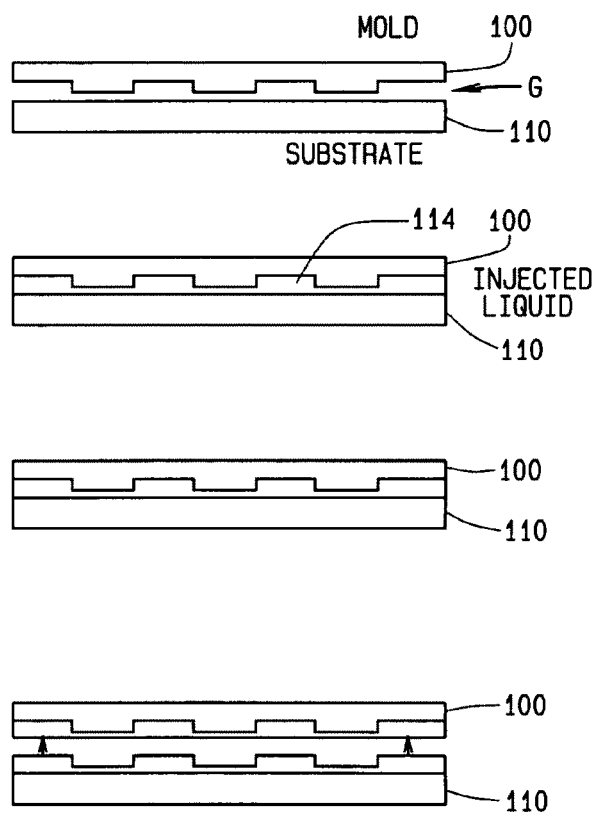
FIG. 12 is a schematic flow diagram of the steps in patterning nanostructures on a substrate by injection molding process.

In patterning nanostructures on a substrate by injection molding process shown in FIG. 12, the substrate 110 and the mold 100 will be positioned and held into place, with a gap G between the mold 100 and substrate 110. A moldable material 114 is injected into the gap G. The injected material 114 can be thermoplastic or a curable material, which is hardened from a liquid or flowable phase under the radiation of light, electric current, chemical reaction, temperature change, or a combination. For thermoplastic molding materials, which change from liquid to solid when the temperature is varied from above a glass temperature to below the glass temperature, the molding is done when the material is soft and flowable and hardening is by lowering the temperature. After hardening, the mold 100 is separated from the molded material 114 which sticks to the substrate 110.

In an example of injection molding, a mold of a quartz and a substrate of silicon is placed together with a gap that be from 1 nanometer to 300 nanometers. Then a liquid is injected into the gap between the mold and the substrate. The liquid is either a curable material of mixed monomer or ligomer solvent and photo-sensitive cross-linking material with viscosity of 0.5 centi-poise to 300 centi-poise, or thermoplastic. After the liquid fills up the gap, UV light with lens 300-400 nanometers, will solidify the photo-curable material and make the material stick to the substrate and finally the substrate will separate from the molded material.

Figure 13:
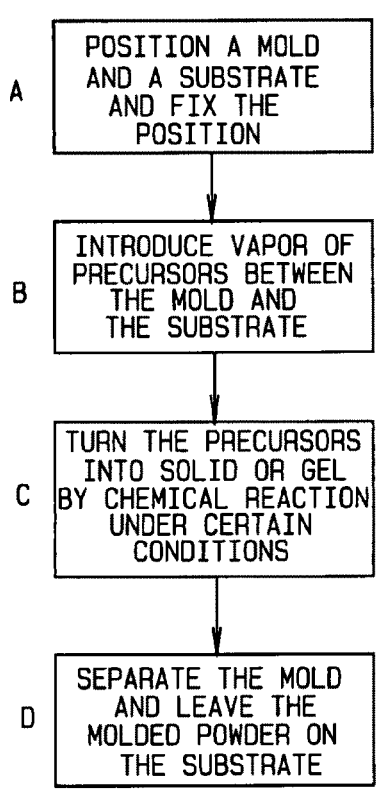
FIG. 13 is a schematic flow diagram of the steps in patterning nanostructures on a substrate by vapor deposition molding.
Figure 13:
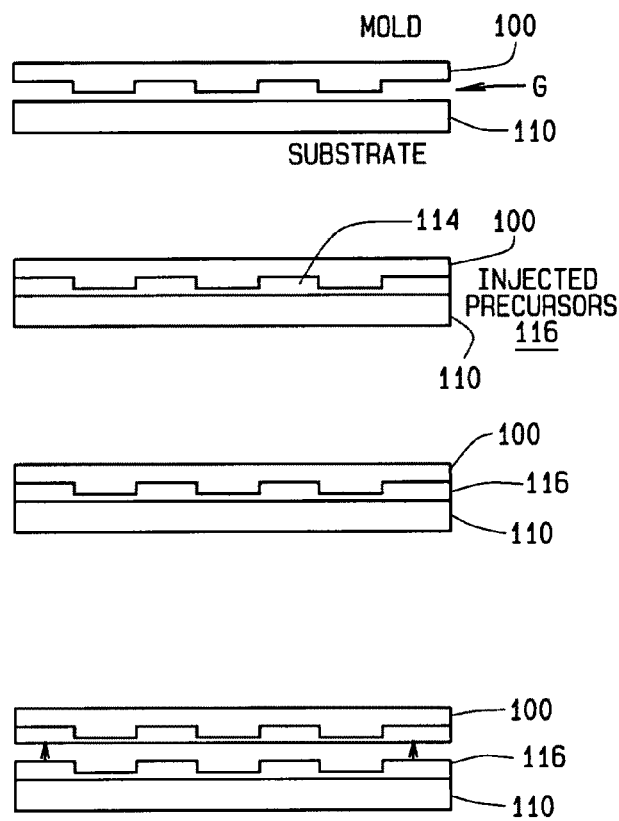

In patterning nanostructures on a substrate by vapor deposition molding shown in FIG. 13, first the substrate 110 (or wafer) and the mold 100 are placed into a fixed position, leaving a gap G between the mold 100 and the substrate 110. Then the gas phase materials 116 (such as precursors) are introduced to fill the gap G between the mold 100 and the substrate 110. Next, certain conditions are applied to render the gas-phase materials into solids or gels. These conditions can be provided by a chemical reaction, light radiation, temperature change, pressure change, or electrical current, and alike. Once the material 116 becomes relatively hardened, the mold 100 can be separated from the substrate 110, and the moldable material 116 will stay on the substrate 110.

In an example of the vapor deposition molding method, the mold and the substrate is placed in a close with a gap of 1 to 300 nanometers. Then the precursors will fill the gap between the mold and the substrates. The chemical reaction will cause, either by shining the light, increasing the temperature or applying a plasma, the material to change from gas phase to solid phase. After the reaction, the molding material will stick to the substrate and the mold can be separated from the molded material.

The precursors 116 for vapor deposition moldings include the precursors for semiconductors, insulators, and metals, such as inorganic compounds, organic components, halogen, organic ligands, organo-metalilics, silyl ether, a silyl ether oligomer, or an organosilicon compound containing one or more reactive groups, $HfSiO_4$, $SiH_4$ or TEOS ($Si(OCH_2CH_3)_4$, tetraethylorthosilicate), methylsilanes $(CH_3)x\ SiH_{4-x}$ (x is 1-4), Be, Ca, Sr, Ba, lanthanide, H, alkyl, perfluroalkyl, perfluoroalkyl, fluoroalkenyl, fluoroalkylamine or fluoroalkenylamine; alkyl, perfluoroalkyl, perfluoroalkenyl, $Au_{140}(SC6)_{30}(SC10COOH)_{23}$ and $Cu^{2+}$, metals, organic metals, alike, and their combinations with different percentages.

Figure 14:
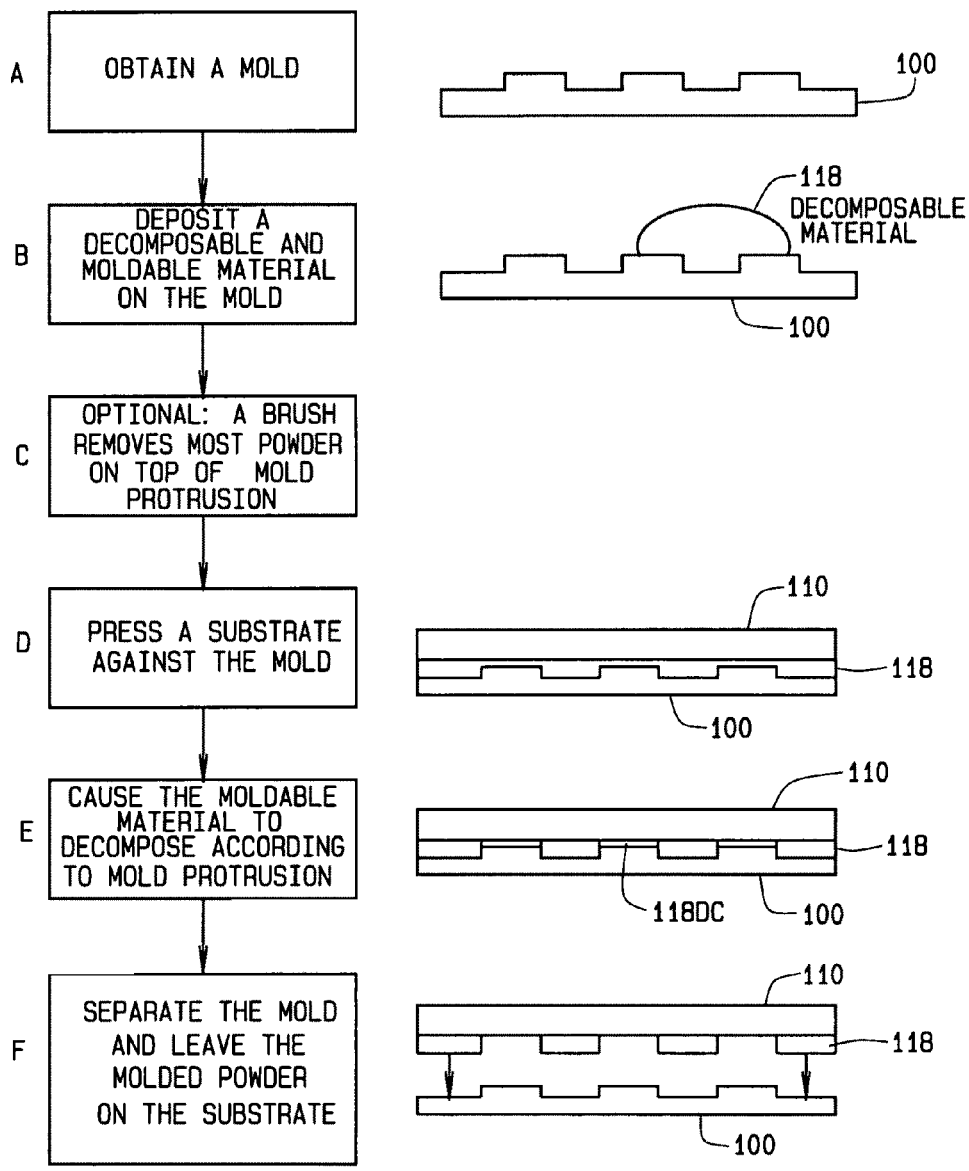
FIG. 14 is a schematic flow diagram of the steps in patterning nanostructures on a substrate by decomposition molding.

In patterning nanostructures on a substrate by decomposition molding as shown in FIG. 14, a decomposable material 118 will be applied to either a mold 100 or a substrate 110 surface. Then the mold 100 and the substrate 110 are pressed together. Under certain conditions, the properties of the decomposable material 118 are changed depending upon the size of the local gap G between the mold 100 and the substrate 110 (e.g. the gap G under the protrusion 102 of the mold 100 is smaller than the size of the gap G under the recess 104 of the mold 100). The resulting decomposed material 118DC has different chemical properties following decomposition of the decomposable material 118. After the separation of the mold 100, the decomposed material 118DC can be removed.

In patterning nanostructures on a substrate by blow molding, a moldable and flowable material is deposited onto the mold and then air pressure will blow at a certain angle on the surfaces to remove the material on the top of the protrusion of the mold, but not the material filling the recess of the mold. After the blowing, the mold will be contacted with a substrate, and the material in the recess of the mold will be hardened and the mold will be separated from the substrate with the material staying on the substrate.

The mold materials (transparent or opique), the substrate materials as well as the moldable materials in the casting molding, injection molding, powder molding, blow molding and the wafer deposition molding and the decomposition will be the same or similar materials as described in the previous and the following sections.

In all forms of patterning described above, to make the molded material stick to the substrate rather than the mold, we can either (a) coating a thin layer of adhesion layer on the substrate and a thin layer of anti-adhesion layer on the mold, or (b) add chemical materials in the moldable material that will make the substrate surface stick and the mold surface anti-stick, or both (a) and (b). The thin layer can be a monomolecular thick layer or multi-molecular thick layer and can be continuous or discontinuous. The specifications are further described below.

In all forms of patterning described above, the lateral dimension of a feature on the mold of 1 nanometer to 2000 nanometer, and the depth of the recess of the mold is from 1 nm to 1000 nm. The mold can have an area smaller or larger than the size of the substrate. In the case that the mold is smaller than the area of the substrate, the patterning will be done on one area of the substrate at a time and then move to other areas of the substrate, in a fashion of called "step and repeat" manner. There are might be alignment marks and schemes on the mold and substrates or on the holders of the mold and substrates for aligning the mold and the substrate.

Uniformly shaped patterns or random patterns may be manufactured, and the materials used in the molding composition may harden, as previously noted, by cooling thermally softened materials, polymerizable materials, chemically reacting materials, vapor depositing materials, or the like. Preferred materials comprise semiconductor, dielectric, photoresponsive, thermally responsive, or electrically responsive substrates or surfaces, such as, but not limited to, inorganic oxides (or sulfides, halides, carbides, nitrides, etc.), rare earth oxides (or sulfides, halides, carbides, nitrides, etc.), inorganic or organic silicon compounds (e.g. silica oxides, sulfides, halides, carbides, nitrides, etc.) and their titanium, germanium, cadmium, zinc and the like counterparts (e.g. titania, zinc oxide [particles or layers], germanium oxide, cadmium sulfide) as continuous or discontinuous coatings or layers, as mixture, dispersions or blends, as layered structures, and like.

The release-coating forming materials of the present invention may be applied in coatings which form less than continuous monomolecular layers of the release material. That is, the release material forms coatings comprising tails of the release moiety secured to the surface by reaction with nominatively inorganic end of the molecule (e.g. the silicon, titanium, germanium, end). The entire surface of the substrate is not necessarily coated, as the release molecules tend to prevent other molecules from aligning uniformly (at least uniformly in a pattern) along the surface. There may be, and most likely always is, some spacing between the individual coating molecules on the surface since, as shown in FIG. 1A the coating does not form as a continuous layer parallel to the coated surface, but rather forms as extended molecules bonded at only one end to the surface, leaving the RELEASE group outwardly extending to provide the release (non-stick) properties. However, the release moiety tail of the compounds evidences an area of lubricity, so a uniform coating is not essential. Coating weights of the release coating material may be used in surprisingly small amounts, considering their effectiveness. For example, coating weights of less than 0.001 mg/m2 of surface area have provided significant release coating effects. Coating weights of 0.001 to 100 or more mg/m2 of surface area, from 0.005 to 5 mg/m2 of surface area, and preferably from 0.01 up to 1 to 5 mg/m2 of surface area are generally useful.

FIGS. 1A-1D show steps in accordance with one embodiment. FIG. 1A shows molding layer 10 having body 12 and molding layer 14. The coating material Si-RELEASE is shown attached to said molding layer 10, although not proportionally. The Si-RELEASE compound is shown as molecules bonded at the Si end, with the RELEASE tail extending there from to provide the release properties to the mold 14. The size of the release compound residues Si-RELEASE is molecular as to the macromolecular view of the molding surface 14 shown in the FIG. 1A. The residual groups which may be attached to the Si (e.g. unreacted H, cyano or halogen) are not shown, merely for convenience in drawing the Figure. As can be seen from this less than literal representation, the RELEASE moities extend away from the molding surface 14. These RELEASE "tails" provide the release property and tend to be fairly durable and persistent. Molding layer 14 is as including a plurality of features 16 having a desired shape. A release layer 17 is shown bonded to the surface of the features 16 on the molding layer 14. A substrate 18 carries thin film layer 20. The film layer 20 is deposited through any appropriate technique such as spin casting, slot die coating, slide coating, curtain coating, solvent coating, gravure coating, screen coating, vapor deposition, sputtering, and the like.

Figure 1B:
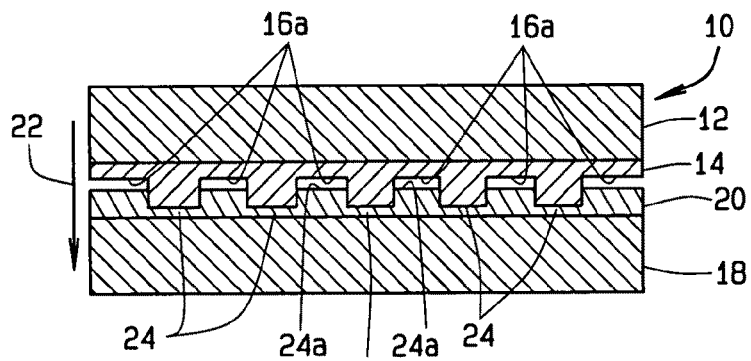
FIG. 1B is a cross sectional view of the mold and substrate of FIG. 1A showing the mold pressed into a thin film carried on the substrate.

FIG. 1B shows a compressive molding step where mold 10 is pressed into thin film layer 20 in the direction shown by arrow 22 forming compressed regions 24. In the embodiment, shown in FIGS. 1A-1D, features 16 are not pressed all of the way into thin film 20 and do not contact substrate 18. In some embodiments, top portions 24a of 20 may contact depressed surfaces 16a of mold 10. This causes top surfaces 24a to substantially conform to the shape of surfaces 16a, for example flat. When contact occurs, this also can stop the mold move into the thin film 20, due to a sudden increase of contact area and hence a decrease of the compressive pressure when the compressive force is constant. The release layer 17 of the present inventions improves the release of the thin film layer 20 from the features 16 of the mold 10.

Figure 1C:
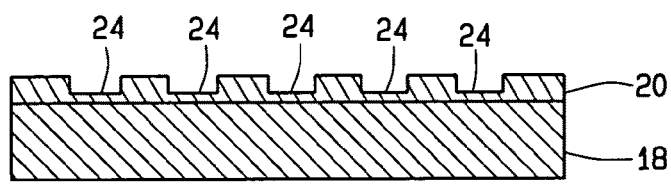
FIG. 1C is a cross sectional view of the substrate of FIG. 1B following compression of the mold into the thin film.
Figure 1D:
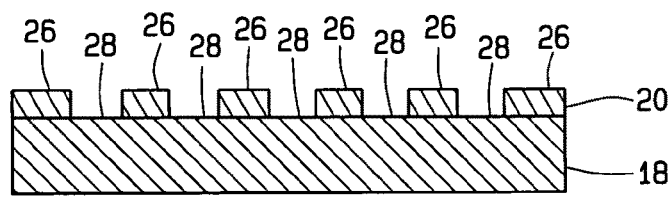
FIG. 1D is a cross sectional view of the substrate of FIG. 1C showing removal of compressed portions of the thin film to expose the underlying substrate.

FIG. 1C is a cross sectional view showing thin film layer 20 following removal of mold 10. Layer 20 includes a plurality of recesses formed at compressed regions 24 which generally conform to the shape of features 16 which is coated with release layer 17. Layer 20 is subjected to a subsequent processing step as shown in FIG. 1D, in which the compressed portions 24 of film 20 are removed thereby exposing substrate 18. This removal may be through any appropriate process such as reactive ion etching, wet chemical etching. This forms dams 26 having recesses 28 on the surface of substrate 18. Recesses 28 form relief features that conform generally to the shape of features 16 and mold 10.

The mold 10 is patterned with features 16 comprising pillars, holes and with a minimum lateral feature size of 25 nm using electron beam lithography, reactive ion etching (RIE) and other appropriate methods. The typical depth of feature 16 is from 5 nm to 200 nm (either including the dimensions of the release layer 17 or excluding those molecular dimensions), depending upon the desired lateral dimension. In general, the mold should be selected to be hard relative to the softened thin film, and can be made of metals, dielectrics, polymers, or semiconductors or ceramics or their combination. In one experiment, the mold 10 consists of a layer 14 and features 16 of silicon dioxide on a silicon substrate 12.

Thin film layer 20 may comprise a thermoplastic polymer or other thermoplastic, hardenable, or curable material which may pass from a flowable state to a non-flowing state upon a change in conditions (e.g. temperature, polymerization, curing or irradiation). During the compressive molding step shown in FIG. 1B, thin film 20 may be heated at a temperature to allow sufficient softening of the film relative to the mold. For example, above the glass transition temperature the polymer has a low viscosity and can flow, thereby conforming to the features 16 without forming a strong adherence to the surface because of the presence of the release layer 17. The film layer may comprise anything from continuous films of materials, to lightly sintered materials, to loose powders held in place by gravity until the compressive and adherent steps of the molding or microreplication processes. For example, the material could be a polymer film, latex film, viscous polymer coating, composite coating, fusible powder coating, blend of adherent and powder, lightly sintered powder, and the like. The polymer may comprise any moldable polymer, including, but not limited to (meth)acrylates (which includes acrylates and methacrylates), polycarbonates, polyvinyl resins, polyamides, polyimides, polyurethanes, polysiloxanes, polyesters (e.g., polyethyeneterephthalate, polyethylenenaphthalate), polyethers, and the like. Materials such as silica, alumina, zirconia, chromia, titania, and other metal oxides (or halides) or semimetal oxides (or halides) whether in dry form or sol form (aqueous, inorganic solvent or organic solvent)

may be used as the moldable material. Composites, mixing both polymeric materials and non-polymeric materials, including microfibers and particulates, may also be used as the molding material.

In one experiment, the thin film 20 was a PMMA spun on a silicon wafer 18. The thickness of the PMMA was chosen from 50 nm to 250 nm. PMMA was chosen for several reasons. First, even though PMMA does not adhere well to the $SiO_2$ mold due to its hydrophilic surface, its adherence can be reduced further by the use of the release layers of the present invention. Good mold release properties are essential for fabricating nanoscale features. Second, shrinkage of PMMA is less than 0.5% for large changes of temperature and pressure. See I. Rubin, Injection Molding, (Wiley, N.Y.) 1992. In a molding process, both the mold 10 and PMMA 20 were first heated to a temperature of 200° C. which is higher than the glass transition temperature of PMMA, 105° C. See M. Harmening, W. Bacher, P. Bley, A. El-Kholi, H. Kalb, B. Kowanz, W. Menz, A. Michael, and J. Mohr, Proceedings IEEE Micro Electro Mechanical Systems, 202 (1992). Then the mold 10 and features 16 were compressed against the thin film 20 and held there until the temperature dropped below the PMMA's glass transition temperature. Various pressures have been tested. It was found that the one preferred pressure is about 400-1900 psi., especially 500-1000 psi. At that pressure, the pattern of the features 16 can be fully transferred into the PMMA, particularly when the release was expedited by the presence of the release layer 17. After removing mold 10, the PMMA in the compressed area was removed using an oxygen plasma, exposing the underlying silicon substrate and replicating the patterns of the mold over the entire thickness of the PMMA. The molding pressure is, of course, dependent upon the specific polymer being used and can therefore vary widely from to material.

Figure 2:
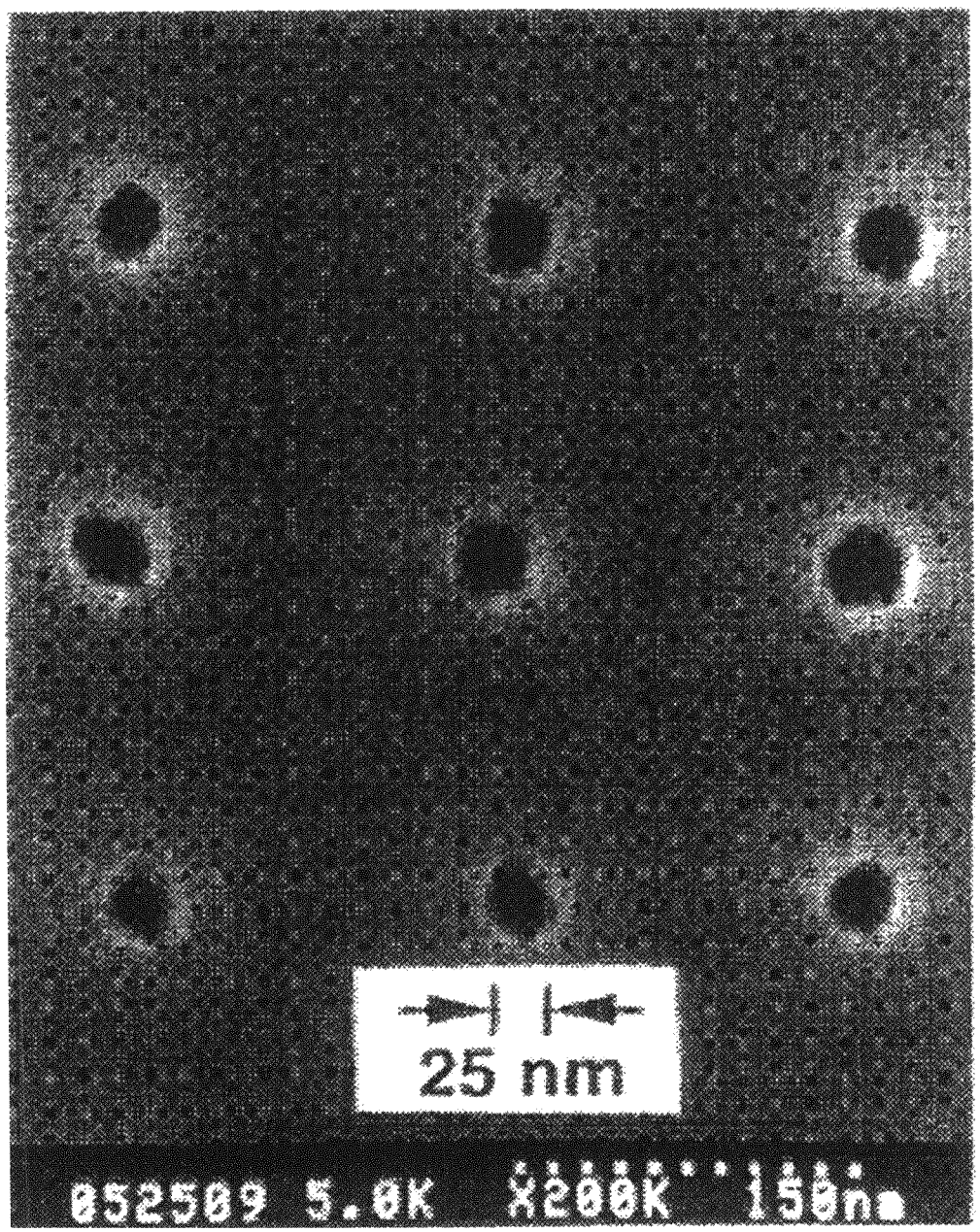
FIG. 2 is a scanning electron micrograph of a top view of 25 nm diameter holes with a 125 nm period formed by compressive molding into a PMMA film as shown in FIG. 1C.

FIG. 2 shows a scanning electron micrograph of a top view of 25 nm diameter holes with a 120 nm period formed into a PMMA film in accordance with FIG. 1C. Mold features as large as tens of microns on the same mold as the nanoscale mold features have been imprinted.

Figure 3:
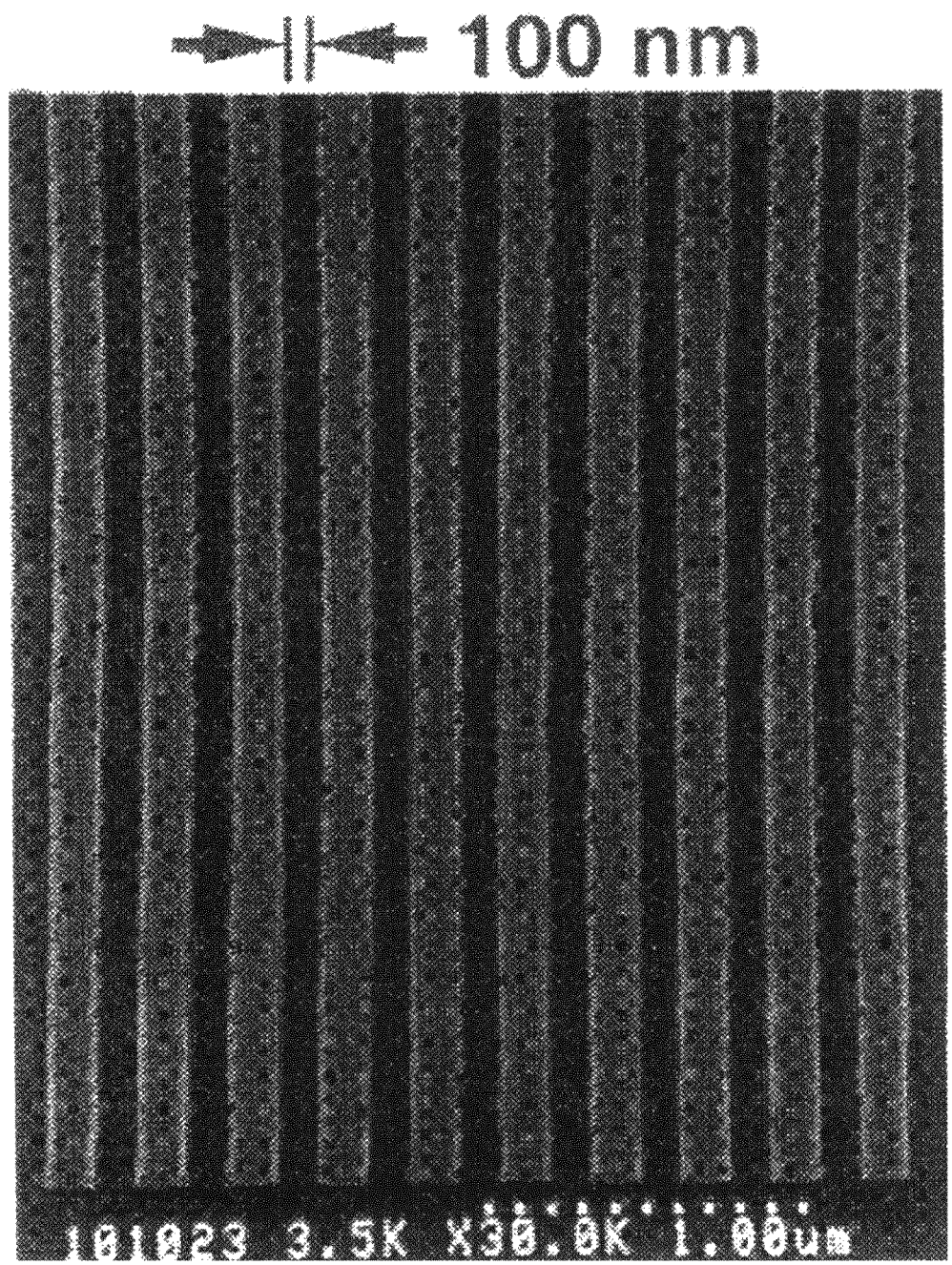
FIG. 3 is a scanning electron micrograph of a top view of a 100 nm wide trench formed by compressive molding into a PMMA film as shown in FIG. 1C.

FIG. 3 shows a scanning electron micrograph of a top view of 100 nm trenches with a 200 nm period formed in PMMA in accordance with FIG. 1C.

Figure 4:
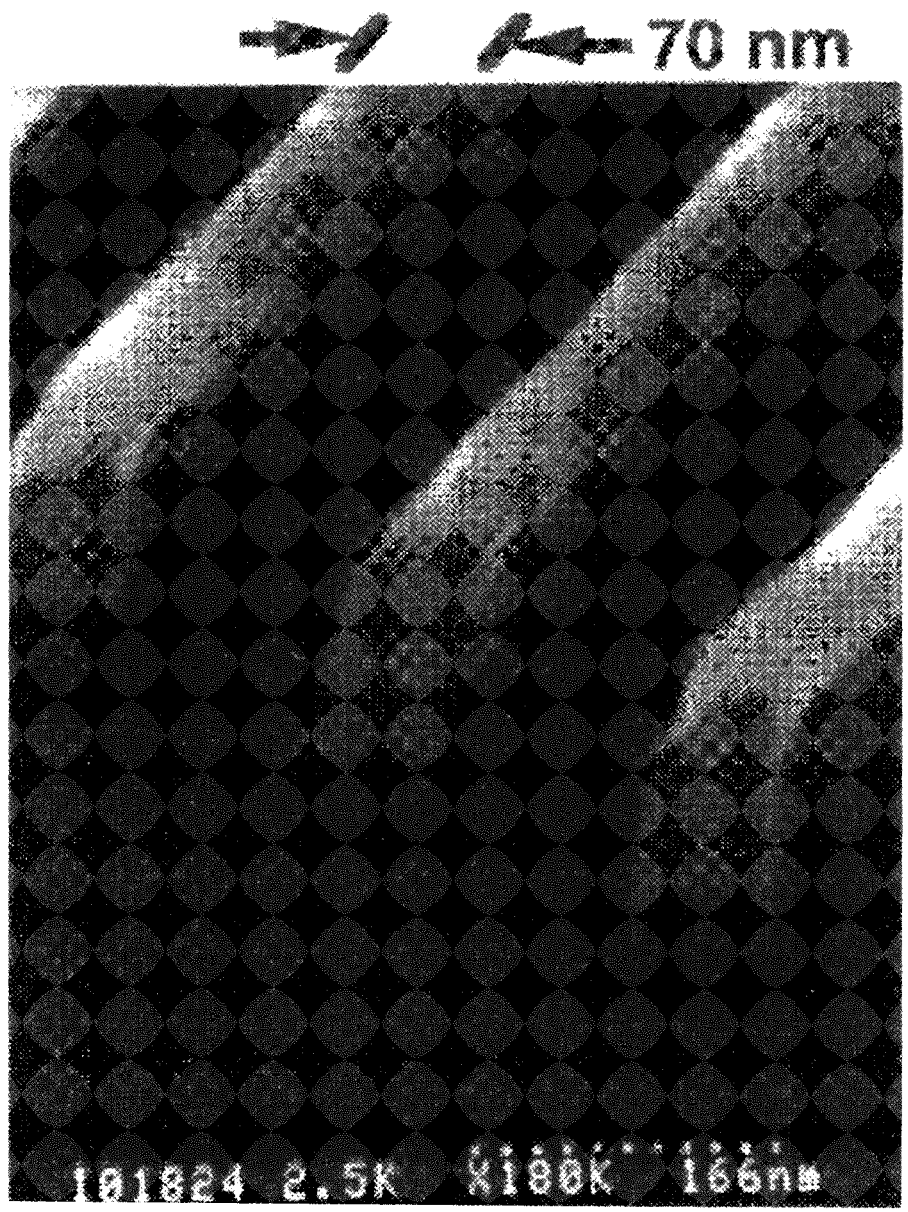
FIG. 4 is a scanning electron micrograph of a perspective view of the stripes formed by compressive molding into a PMMA film as shown in FIG. 1C. The stripes are 70 nm wide and 200 nm tall, and have a high aspect ratio, a surface roughness less than 3 nm, and corners of nearly a perfect 90 degrees.

FIG. 4 is a scanning electron micrograph of a perspective view of trenches made in the PMMA using the present invention with embodiment that top portions 24a of film 20 contact depressed surfaces 16a of mold 10. The strips are 70 nm wide, 200 nm tall, therefore a high aspect ratio. The surface of these PMMA features is extremely smooth and the roughness is less than 3 nm. The corners of the strips are nearly a perfect 90 degrees. Such smoothness, such sharp right angles, and such high aspect ratio at the 70 nm features size cannot be obtained with the prior art.

Furthermore, scanning electron microscopy of the PMMA patterns and the mold showed that the lateral feature size and the smoothness the sidewalls of PMMA patterns fabricated using the present invention conform with the mold. From our observations, it is clear that the feature size achieved so far with the present invention is limited by our mold size. From the texture of the imprinted PMMA, it appears that 10 nm features can be fabrication with the present invention.

Figure 5A:
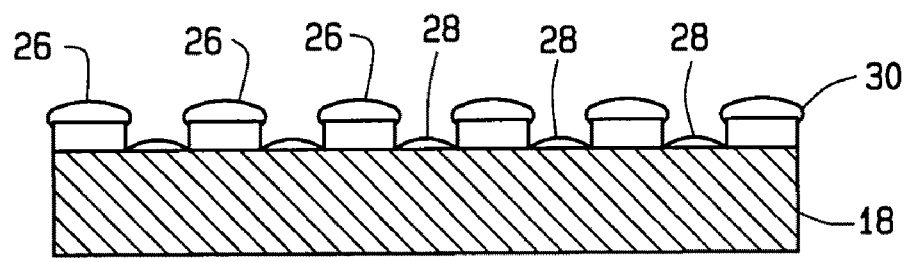
FIG. 5A is a cross sectional view of the substrate of FIG. 1D following deposition of a material.
Figure 5B:
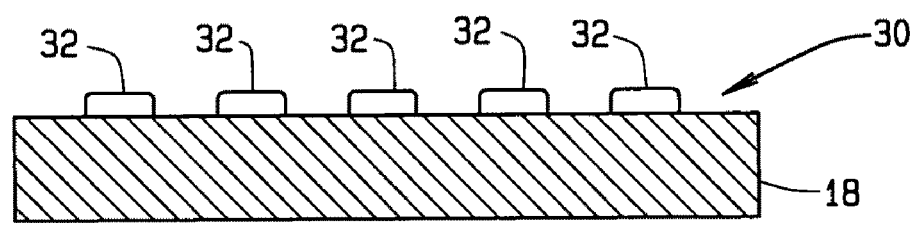
FIG. 5B is a cross sectional view of the substrate of FIG. 5A following selective removal of the material by a lift-off process.

After the steps 1A-1D, the patterns in film 20 can be replicated in a material that is added on substrate 18 or can be replicated directly into substrate 18. FIGS. 5A and 5B show one example of the subsequent steps which follow the steps of FIGS. 1A-1D. Following formation of the recesses 28 shown in FIG. 1 D, a layer of material 30 is deposited over substrate 18 as shown in FIG. 5A. Material 30 is deposited through any desired technique over dams 26 and into recesses 28 between dams 26. Material 30 may comprise, for example, electrical conductors or semiconductors or dielectrics of the type used to fabricate integrated circuits, or it comprise ferromagnetic materials for magnetic devices. Next, a lift off process is performed in which a selective chemical etch is applied which removes dams 26 causing material 30 deposited on top of dams 26 to be removed. FIG. 5B shows the structure which results following the lift off process. A plurality of elements 32 formed of material 30 are left on the surface of substrate 18. Elements 32 are of the type used to miniaturized devices such as integrated circuits. Subsequent processing steps to those shown in steps 1A-1D may be repeated to form additional layers on substrate 18.

Figure 6:
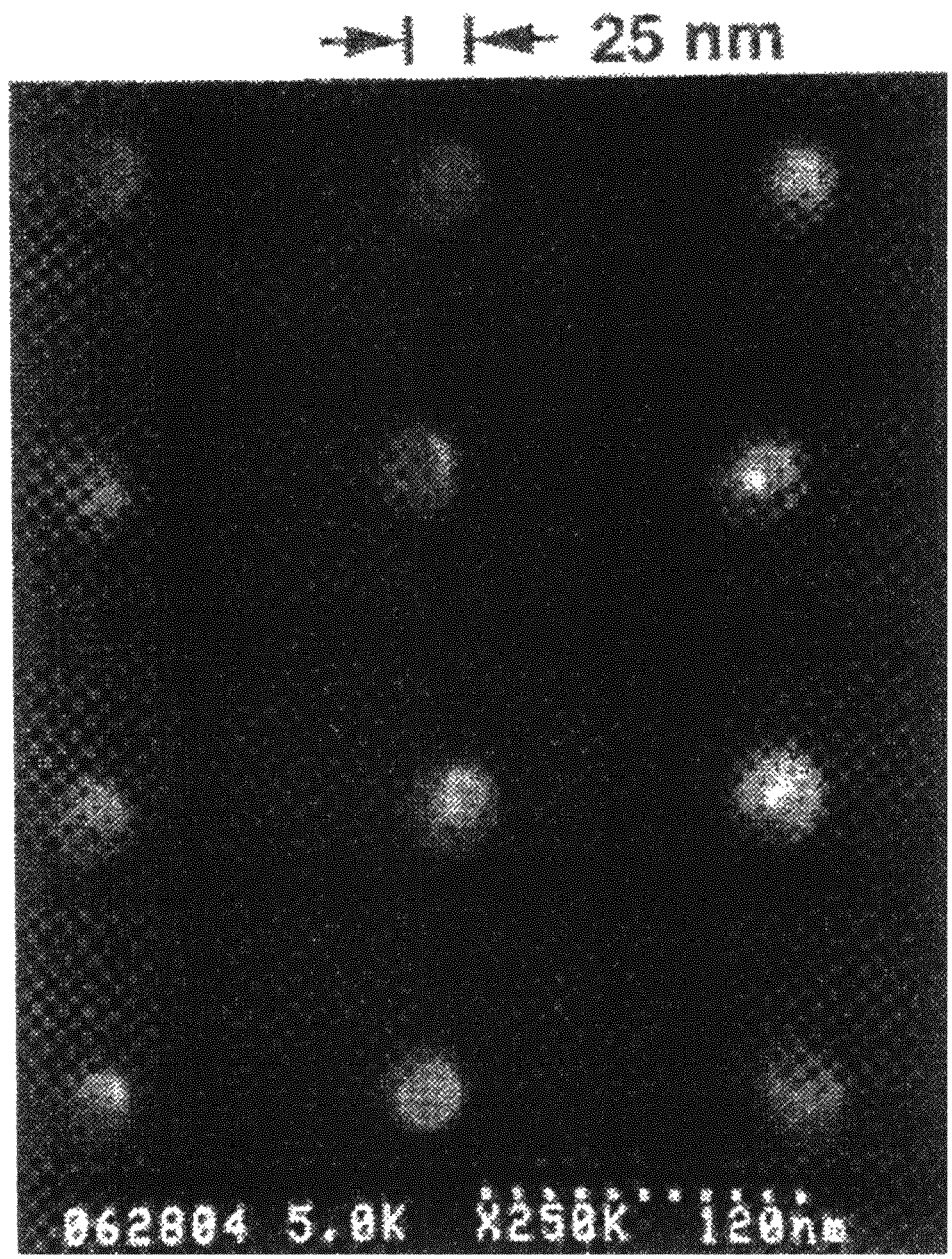
FIG. 6 is a scanning electron micrograph of the substrate of FIG. 2 following deposition of material and a lift off process. The metal dots have a 25 nm diameter that is the same as that of the holes created in the PMMA shown in FIG. 2.

FIG. 6 is a scanning electron micrograph of the substrate of FIG. 2 following deposition of 5 nm of titanium and 15 nm of gold and a lift off process. In the lift-off process, the wafers were soaked in acetone to dissolve the PMMA and therefore lift-off metals which were on the PMMA. The metal dots have a 25 nm diameter that is the same as that of the holes created in the PMMA using the present invention.

Figure 7:
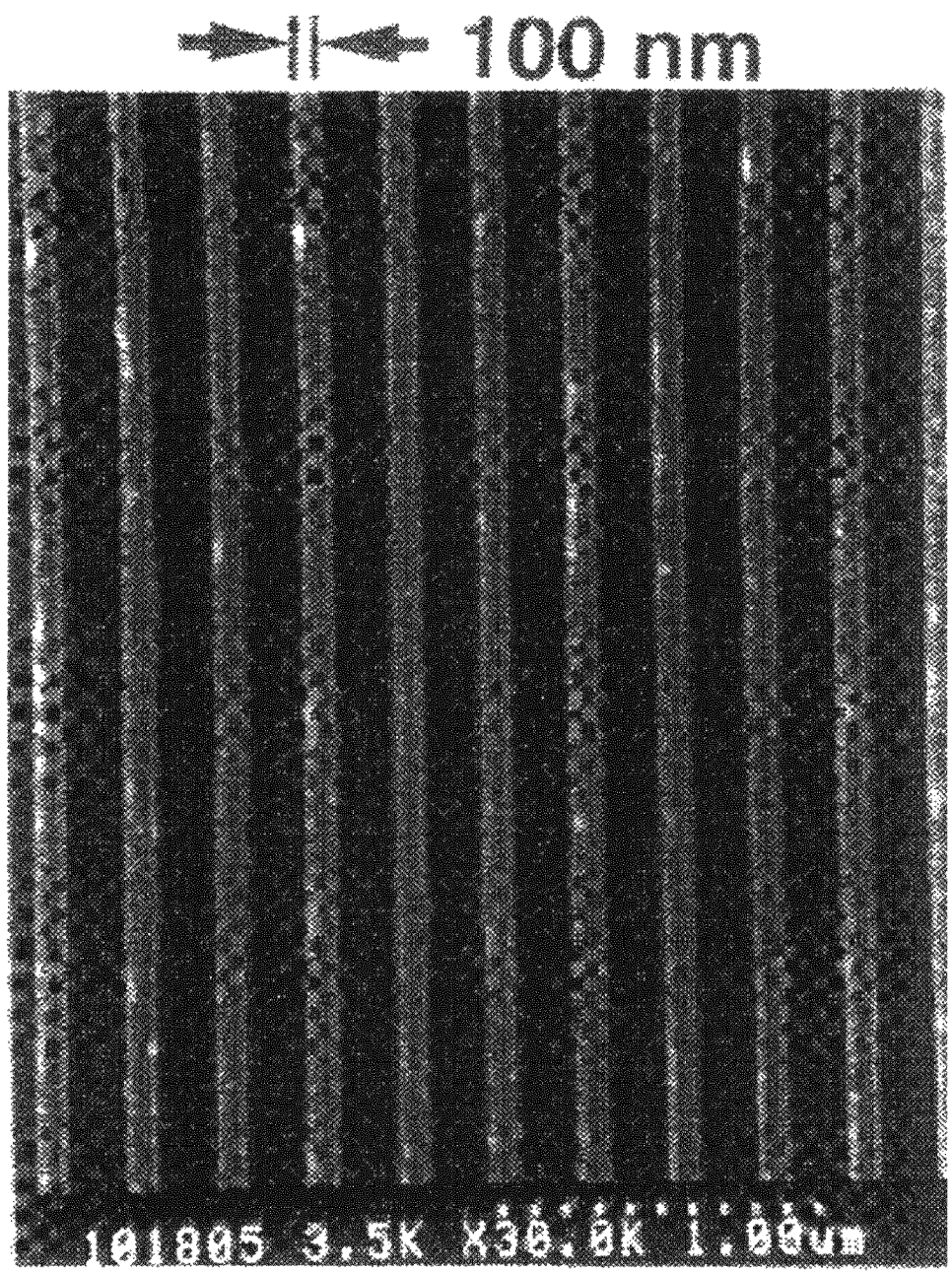
FIG. 7 is a scanning electron micrograph of the substrate of FIG. 3 following deposition of material and a lift off process. The metal line width is 100 nm that is the same as the width of the PMMA trenches shown in FIG. 3.

FIG. 7 is a scanning electron micrograph of the substrate of FIG. 3 following deposition of 5 nm of titanium and 15 nm of gold and a off process. The metal line width is 100 nm that is the same as the width of the PMMA trenches shown in 3. FIGS. 6 and 7 have demonstrated that, during the oxygen RIE process in the present invention, the compressed PMMA area was completely removed and the lateral size of the PMMA features has not been changed significantly.

Figure 8:
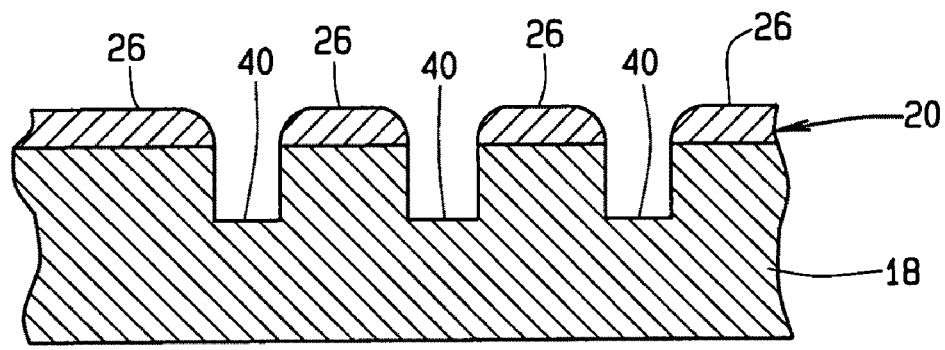
FIG. 8 is a cross sectional view of the substrate of FIG. 1D following subsequent processing.

FIG. 8 is a cross sectional view of substrate 18 of FIG. 1D following an example alternative processing step that replicates the patterns in film 20 directly into substrate 18. In FIG. 8, substrate 18 has been exposed to an etching process such as reactive ion etching, chemical etching, etc., such that recesses 40 are in substrate 18. These recesses 40 may be used for subsequent processing steps. For example, recesses 40 may be filled with material for use in fabricating a device. This is just one example of a subsequent processing step which can be used in conjunction with the present invention.

Molding processes typically use two plates to form malleable material there between. In the present invention, substrate 18 and body 12 (mold 10) act as plates for the imprint process of the invention. Substrate 18 and body 12 should be stiff to reduce bending while forming the imprint. Such bending leads to deformation in the pattern formed in the film 20.

Figure 9:
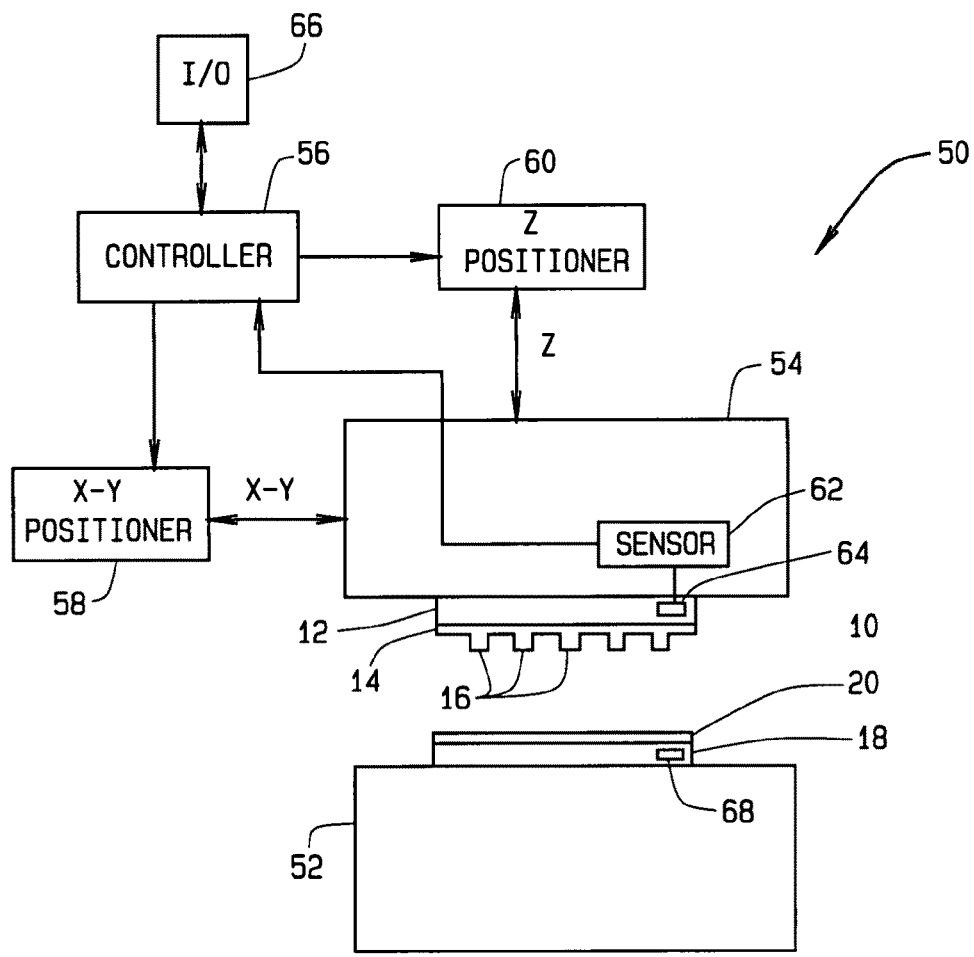
FIG. 9 is a simplified block diagram of an apparatus in accordance with one embodiment of the invention.

FIG. 9 is a simplified block diagram of apparatus 50 for performing nanoimprint lithography in accordance with the invention. Apparatus 50 includes stationary block 52 carrying substrate 18 and movable molding block 54 carrying mold 10. Blocks 52 and 54 carry substrate 18 and mold 10 depicted in FIG. 1A-1D. A controller 56 couples to x-y positioner 58 and z positioner 60. An alignment mark 64 is on mold 10 and complimentary mark 68 is on substrate 18. Sensor 62 carried in block 54 couples to alignment marks 64 and 68 and provide an alignment signal to controller 56. Controller 56 is also provided with input output circuitry 66.

In operation, controller 56 controls the imprinting of mold 10 into film 20 on substrate 18 by actuating z positioner 60 which moves block 54 in the z direction relative to block 52. During the imprinting process, precise alignment of mold 10 and film 20 is crucial. This is achieved using optical or electrical alignment techniques. For example, sensor 62 and alignment marks 64 and 68 may be an optical detector and optical alignment marks which generate a moire alignment pattern such that moire alignment techniques may be employed to position mold 10 relative to film 20. Such techniques are described by Nomura et al. A MOIRE ALIGN- MENT TECHNIQUE FOR MIX AND MATCH LITHOGRAPHIC SYSTEM, J. Vac. Sci. Technol. B6(1), January/February 1988, pg. 394 and by Hara et al., AN ALIGNMENT TECHNIQUE USING DEFRACTED MOIRE SIGNALS J. Vac. Sci, Technol. B7(6) November/December 1989, pg. 1977. Controller 56 processes this alignment information and adjusts the position of block 54 in the x-y plane relative to film 20 using x-y positioner 58. In another embodiment, alignment marks 64 and 68 comprise plates of a capacitor such that sensor 62 detects capacitance between marks 64 and 68. Using this technique, alignment is achieved by moving block 54 in the x-y plane to maximize the capacitance between alignment marks 64 and 68. During imprinting, controller 56 may also monitor and control the temperature of film 20.

It should be understood that the invention is not limited to the specific technique described herein, and may be implemented in any appropriate lithographic process. Generally, the mold should be hard relative to the film during the molding process. This may be achieved for example, by sufficiently heating the film. Additionally, it should be understood that the invention is not limited to the particular film described herein. For example, other types of films may be used. In one alternative embodiment, a thin film may be developed which has a chemical composition which changes under pressure. Thus, following the imprint process, a chemical etch could be applied to the film which selectively etches those portions whose composition had changed due to applied pressure. In anther embodiment, after molding of the thin film to create a thickness contrast in the thin film, a material is deposited on the thin film and the thickness contrast then is transferred into the substrate.

Although the present invention has been described with reference to preferred embodiments, workers skilled in the art will recognize that changes may be made in form and detail without departing from the spirit and scope of the invention.

The invention claimed is:

1. A method of forming a pattern on a surface of a substrate comprising the steps of:
providing a substrate;
providing a mold having a molding surface comprised of one or more protruding features and one or more recessed features for imprinting a pattern comprising at least one feature having a lateral dimension of about 2000 nanometers or less;
coating an anti-adhesive layer on said mold;
depositing a hardenable, flowable material onto the mold to flow into the one or more recessed features;
pressing the mold and the substrate together;
hardening the flowable material and adhering the moldable material to the substrate;
separating the mold and the substrate to leave the hardened material on the substrate; and
wherein the anti-adhesive layer is a monomolecular layer that is continuous or discontinuous.

2. The method of claim 1 wherein the hardening of the flowable material comprises exposing the material to light, electrical current, change in temperature, or chemical reaction.

3. The method of claim 1 wherein the adhering of the moldable material to the substrate comprises coating an adhesive layer on the substrate.

4. The method of claim 1 wherein the adhering of the moldable material to the substrate comprises adding to the moldable material a chemical to promote preferential adhesive to the substrate.

5. The method of claim 1 wherein the molding surface comprises a material selected from a group of materials including metal oxides, metal carbides, metal nitrides, semimetals, semimetal oxides, semimetal carbides and semimetal nitrides.

6. The method of claim 1 wherein the substrate comprises a material selected from the group consisting of polymers, semiconductors, photoconductors, ceramics and glasses.

7. The process of claim 1 further comprising the step of removing a portion of the flowable material from the mold prior to pressing.

8. The method of claim 7 wherein the removing of a portion of the flowable material on the substrate comprises brushing the flowable material with a brush, blade or airbrush.

9. A method of forming a pattern on a surface of a substrate comprising the steps of:
providing a substrate;
providing a mold having a molding surface comprised of one or more protruding features and one or more recessed features for imprinting a pattern comprising at least one feature having a lateral dimension of about 2000 nanometers or less;
coating an anti-adhesive layer on said mold;
depositing a hardenable powder onto the mold, said powder flowing into one or more recessed features of the molding surface;
pressing the mold and the substrate together;
hardening the powder and adhering the powder to the substrate;
separating the mold and the substrate to leave the hardened powder on the substrate; and
wherein the anti-adhesive layer is a monomolecular layer that is continuous or discontinuous.

10. The method of claim 9 wherein the step of hardening the flowable powder includes exposing the flowable powder to at least one catalyst selected from a set of catalysts including light, an electrical current, a change in temperature, or a chemical reaction.

11. The method of claim 9 wherein the adhering of the moldable material to the substrate comprises coating an adhesive layer on the substrate.

12. The method of claim 9 wherein the adhering of the moldable material to the substrate comprises adding to the moldable material a chemical to promote preferential adhesive to the substrate.

13. The method of claim 9 wherein the molding surface comprises a material selected from a group of materials including metal oxides, metal carbides, metal nitrides, semimetals, semimetal oxides, semimetal carbides and semimetal nitrides.

14. The method of claim 9 wherein the substrate comprises a material selected from the group consisting of polymers, semiconductors, photoconductors, ceramics and glasses.

15. The process of claim 9 further comprising the step of removing a portion of the flowable powder from the mold prior to pressing.

16. The method of claim 15 wherein the step of removing of a portion of the flowable powder from the mold comprises brushing the flowable material from the mold with at least one of a brush, a blade, or an airbrush.

17. The method of claim 1 wherein a depth of said one or more recessed features on said molding surface of said mold are in the range of 5 nm to 200 nm.

18. The method of claim 9 wherein a depth of said one or more recessed features on said molding surface of said mold are in the range of 5 nm to 200 nm.

* * * * *